US011676764B2

(12) United States Patent
Takei (10) Patent No.: US 11,676,764 B2
(45) Date of Patent: Jun. 13, 2023

(54) CERAMIC ELECTRONIC COMPONENT WITH ADJUSTED HYDROGEN TITANIUM RATIO (71) Applicant: TAIYO YUDEN CO., LTD., Tokyo (JP)

(72) Inventor: Shigeto Takei, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 26 days.

(21) Appl. No.: 16/953,142

(22) Filed: Nov. 19, 2020

(65) Prior Publication Data

US 2021/0175020 A1 Jun. 10, 2021

(30) Foreign Application Priority Data

Dec. 6, 2019 (JP) .............................. JP2019-221612

(51) Int. Cl.
H01G 4/30 (2006.01)
H01G 4/008 (2006.01)
H01G 4/12 (2006.01)
H01G 4/248 (2006.01)
(Continued)

(52) U.S. Cl.
CPC ............... H01G 4/30 (2013.01); H01G 4/008 (2013.01); H01G 4/1227 (2013.01); H01G 4/248 (2013.01); H01G 13/00 (2013.01); H05K 1/185 (2013.01); H05K 2201/10015 (2013.01)

(58) Field of Classification Search
CPC ........ H01G 4/30; H01G 4/008; H01G 4/1227; H01G 4/248; H01G 2/065; H01G 4/232; H05K 1/185; H05K 2201/10015
See application file for complete search history.

(56) References Cited

U.S. PATENT DOCUMENTS 11,302,479 B2 * 4/2022 Yoshino ................. H01G 4/008
2007/0025056 A1 * 2/2007 Nishikawa ............. H01G 4/012
361/303
2007/0230086 A1 10/2007 Saita et al.
(Continued)

FOREIGN PATENT DOCUMENTS

JP  H1-80011 A   3/1989
JP  2007-294937 A  11/2007
(Continued)

Primary Examiner — David M Sinclair
Assistant Examiner — Daniel M Dubuisson
(74) Attorney, Agent, or Firm — Chen Yoshimura LLP (57) ABSTRACT A ceramic electronic component includes a multilayer structure having a substantially rectangular parallelepiped shape and including dielectric layers and internal electrode layers that are alternately stacked, the dielectric layers being mainly composed of ceramic, the internal electrode layers being alternately exposed to two edge faces of the multilayer structure opposite to each other, wherein x/y is 0.143 or less where x represents an average concentration of hydrogen in ppm in a capacitance section where the internal electrode layers exposed to one of the two edge faces and the internal electrode layers exposed to the other of the two edge faces are opposed to each other, as measured by secondary ion mass spectrometry (SIMS), and y represents an average concentration of titanium in ppm in the capacitance section, as measured by SIMS at the same time of measuring the average concentration of hydrogen.

17 Claims, 11 Drawing Sheets (51) Int. Cl.
*H05K 1/18* (2006.01)
*H01G 13/00* (2013.01)

(56) References Cited

U.S. PATENT DOCUMENTS

| | | | |
|---|---|---|---|
| 2010/0003475 A1 | 1/2010 | Yamaguchi | |
| 2013/0128411 A1* | 5/2013 | Tahara | H01G 4/12 |
| | | | 361/321.2 |
| 2015/0041197 A1* | 2/2015 | Lee | H01G 2/06 |
| | | | 361/301.4 |
| 2016/0086733 A1 | 3/2016 | Saito et al. | |
| 2016/0217930 A1* | 7/2016 | Yamaguchi | H01G 4/0085 |
| 2016/0268046 A1* | 9/2016 | Nishisaka | H01G 4/232 |
| 2018/0033557 A1* | 2/2018 | Chien | H01G 4/236 |
| 2019/0035557 A1* | 1/2019 | Yamada | H05K 1/181 |
| 2020/0105473 A1* | 4/2020 | Martinez | H01G 4/224 |
| 2021/0020368 A1* | 1/2021 | Yoshino | H01G 4/232 |

FOREIGN PATENT DOCUMENTS

| | | |
|---|---|---|
| JP | 2016-66783 A | 4/2016 |
| JP | 2016-136562 A | 7/2016 |
| JP | 2019-009392 A | 1/2019 |
| WO | 2007/026562 A2 | 3/2007 |

\* cited by examiner

CERAMIC ELECTRONIC COMPONENT WITH ADJUSTED HYDROGEN TITANIUM RATIO

FIELD

A certain aspect of the present disclosure relates to a ceramic electronic component, a mounting board, and a manufacturing method of a ceramic electronic component.

BACKGROUND

In the ceramic electronic component of the multilayer ceramic capacitor, hydrogen absorbed in the internal electrode layer degrades the insulation resistance of the dielectric layer. For example, Japanese Patent Application Publication No. H1-80011 (Patent Document 1) discloses a technique that adds a metal (for example, Ni) that prevents the absorption of hydrogen to the internal electrode when the internal electrode mainly composed of a noble metal (for example, an Ag—Pd alloy) is used. For example, Japanese Patent Application Publication No. 2016-66783 (Patent Document 2) discloses a technique that introduces a protection layer containing $Cu_2O$ between the external electrode body formed on the surface of the multilayer structure so as to be electrically connected to the internal electrode and a plated layer formed on the external electrode body.

RELATED ART DOCUMENTS

Patent Documents

Patent Document 1: Japanese Patent Application Laid-Open Publication No. H1-80011
Patent Document 2: Japanese Patent Application Laid-Open Publication No. 2016-66783

SUMMARY OF THE INVENTION

However, the above techniques may be unable to achieve sufficient insulation resistance.

The present invention has a purpose of providing a ceramic electronic component, a mounting board, and a manufacturing method of a ceramic electronic component capable of achieving sufficient insulation resistance.

In one aspect of the present disclosure, there is provided a ceramic electronic component including: a multilayer structure having a substantially rectangular parallelepiped shape and including dielectric layers and internal electrode layers that are alternately stacked, the dielectric layers being mainly composed of ceramic, the internal electrode layers being alternately exposed to two edge faces of the multilayer structure opposite to each other, wherein x/y is 0.143 or less where x represents an average concentration of hydrogen in ppm in a capacitance section where the internal electrode layers exposed to one of the two edge faces and the internal electrode layers exposed to the other of the two edge faces are opposed to each other, as measured by secondary ion mass spectrometry (SIMS), and y represents an average concentration of titanium in ppm in the capacitance section, as measured by SIMS at the same time of measuring the average concentration of hydrogen.

The above-described ceramic electronic component may further include a pair of external electrodes respectively formed on the two edge faces, and the external electrode may include a plated layer.

In the above-described ceramic electronic component, an electric resistance of each of the dielectric layers may be 100 MΩ or greater in a stack direction of the dielectric layers.

In the above-described ceramic electronic component, a height of the ceramic electronic component may be 0.3 mm or less in a stack direction of the dielectric layers.

In the above-described ceramic electronic component, the internal electrode layer may be mainly composed of nickel, and the dielectric layer may be mainly composed of barium titanate.

In the above-described ceramic electronic component, the ceramic electronic component may be a multilayer ceramic capacitor, and the multilayer ceramic capacitor may have X7R characteristics, may have a 0603 size, may have a rated voltage of 16 V or 25 V, and may have a capacitance value of 0.22 µf or greater.

In the above-described ceramic electronic component, the ceramic electronic component may be a multilayer ceramic capacitor, and the multilayer ceramic capacitor may have X7R characteristics, may have a 1005 size, may have a rated voltage of 25 V, and may have a capacitance value of 0.47 µf or greater, or the multilayer ceramic capacitor has X7R characteristics, may have a 1005 size, may have a rated voltage of 50 V, and h may have as a capacitance value of 0.22 µf or greater.

In another aspect, the present disclosure provides a component installed board including: a mounting board; and the above-described ceramic electronic component, installed in the mounting board.

In the above-described component installed board, the mounting board may include a pair of insulating layers, and the ceramic electronic component may be disposed between the pair of insulating layers of the mounting board.

In another aspect, the present disclosure provides a manufacturing method of a ceramic electronic component, including: preparing a multilayer structure having a substantially rectangular parallelepiped shape and including dielectric layers and internal electrode layers that are alternately stacked, the dielectric layers being mainly composed of ceramic, the internal electrode layers being alternately exposed to two edge faces of the multilayer structure opposite to each other; and adjusting x/y to be 0.143 or less by subjecting the multilayer structure to heat treatment, where x represents an average concentration of hydrogen in ppm in a capacitance section where the internal electrode layers exposed to one of the two edge faces and the internal electrode layers exposed to the other of the two edge faces are opposed to each other, as measured by secondary ion mass spectrometry (SIMS), and y represents an average concentration of titanium in ppm in the capacitance section, as measured by SIMS at the same time of measuring the average concentration of hydrogen.

In the above-described manufacturing method, in the heat treatment, a $H_2$ concentration in an atmosphere gas may be adjusted to be 0.1% or greater and less than 3.0%, and a heat treatment time may be adjusted to be 100 minutes or greater and 150 minutes or less.

In the above-mentioned manufacturing method, in the heat treatment, a heat treatment temperature may be 150° C. or greater and 580° C. or less.

DETAILED DESCRIPTION

Hereinafter, with reference to the accompanying drawings, embodiments will be described.

First Embodiment

Figure 1:
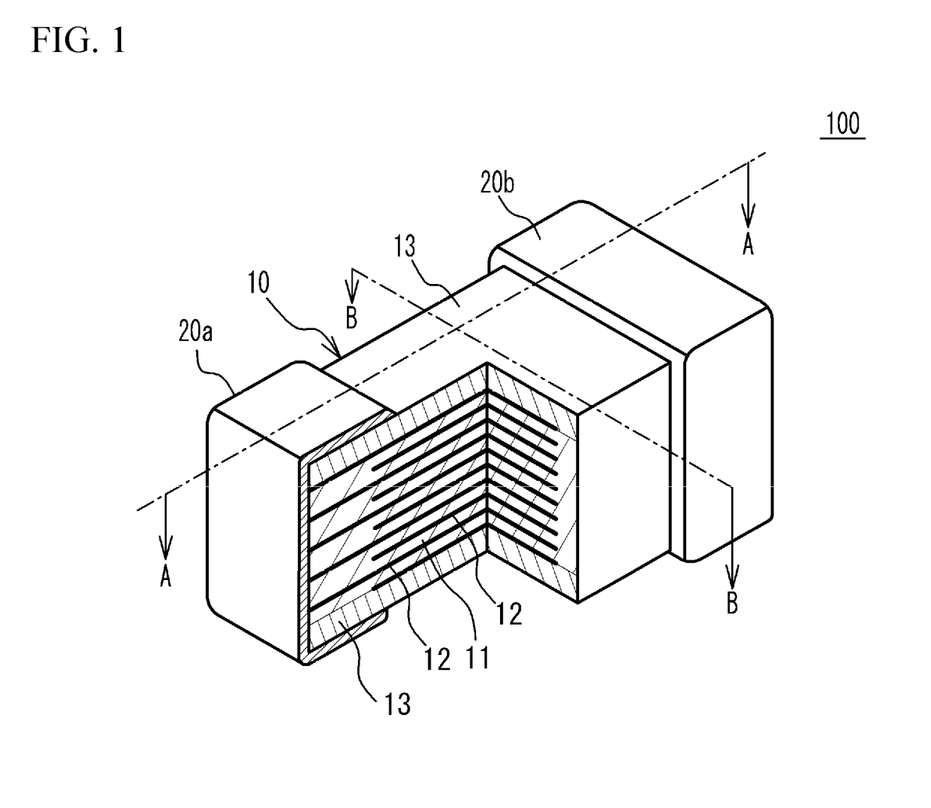
FIG. 1 is a partial cross-sectional perspective view of a multilayer ceramic capacitor.
Figure 2:
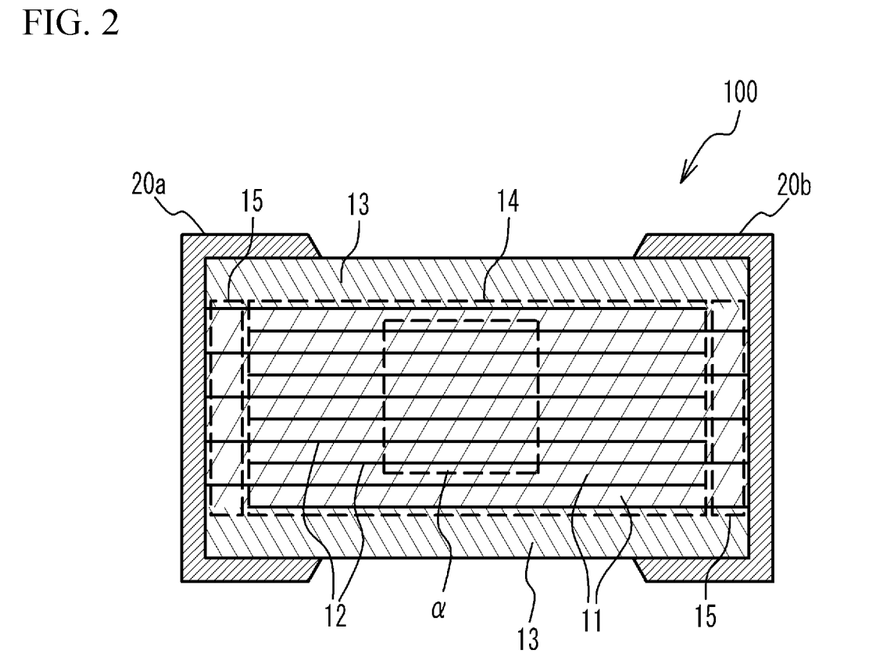
FIG. 2 is a cross-sectional view taken along line A-A in FIG. 1.
Figure 3:
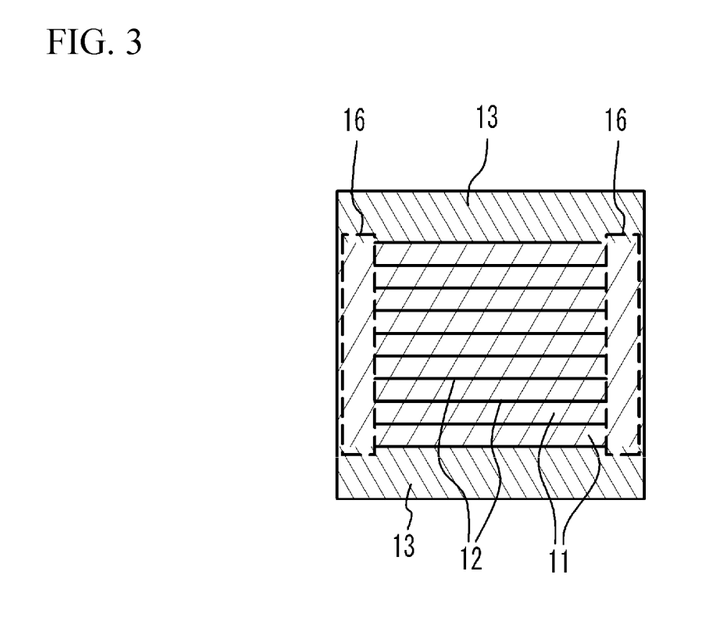
FIG. 3 is a cross-sectional view taken along line B-B in FIG. 1.

FIG. 1 is a partial cross-section perspective view of a multilayer ceramic capacitor 100 in accordance with an embodiment. FIG. 2 is a cross-sectional view taken along line A-A in FIG. 1. FIG. 3 is a cross-sectional view taken along line B-B in FIG. 1. As illustrated in FIG. 1 to FIG. 3, the multilayer ceramic capacitor 100 includes a multilayer chip 10 having a rectangular parallelepiped shape, and external electrodes 20a and 20b respectively provided on two edge faces of the multilayer chip 10 opposite to each other. Among four side faces other than the two edge faces of the multilayer chip 10, two faces other than the top face and the bottom face in the stack direction are referred to as side faces. Each of the external electrodes 20a and 20b extend to the top face and the bottom face in the stack direction of the multilayer chip 10 and two side faces of the multilayer chip 10. However, the external electrodes 20a and 20b are spaced from each other.

The multilayer chip 10 has a structure designed to have dielectric layers 11 and internal electrode layers 12 alternately stacked. The dielectric layer 11 contains a ceramic material acting as a dielectric material. The internal electrode layer 12 contains a metal material. Edges of the internal electrode layers 12 are alternately exposed to a first edge face of the multilayer chip 10 and a second edge face of the multilayer chip 10 that is different from the first edge face. The external electrode 20a is provided on the first edge face. The external electrode 20b is provided on the second edge face. Thus, the internal electrode layers 12 are alternately electrically connected to the external electrode 20a and the external electrode 20b. As a result, the multilayer ceramic capacitor 100 has a structure in which the dielectric layers 11 are stacked with the internal electrode layers 12 interposed therebetween. In the multilayer structure of the dielectric layers 11 and the internal electrode layers 12, the outermost layers in the stack direction are the internal electrode layers 12, and the top face and the bottom face of the multilayer structure are covered with respective cover layers 13. The cover layer 13 is mainly composed of a ceramic material. For example, the main component of the cover layer 13 may be the main component of the dielectric layer 11.

For example, the multilayer ceramic capacitor 100 may have a length of 0.25 mm, a width of 0.125 mm, and a height of 0.125 mm. The multilayer ceramic capacitor 100 may have a length of 0.4 mm, a width of 0.2 mm, and a height of 0.2 mm. The multilayer ceramic capacitor 100 may have a length of 0.6 mm, a width of 0.3 mm, and a height of 0.3 mm. The multilayer ceramic capacitor 100 may have a length of 1.0 mm, a width of 0.5 mm, and a height of 0.5 mm. The multilayer ceramic capacitor 100 may have a length of 3.2 mm, a width of 1.6 mm, and a height of 1.6 mm. The multilayer ceramic capacitor 100 may have a length of 4.5 mm, a width of 3.2 mm, and a height of 2.5 mm. However, the size of the multilayer ceramic capacitor 100 is not limited to the above sizes. The height means the height in the direction in which the dielectric layers 11 are stacked (the stack direction).

The internal electrode layer 12 is mainly composed of a base metal such as nickel (Ni), copper (Cu), or tin (Sn). The internal electrode layer 12 may be composed of a noble metal such as platinum (Pt), palladium (Pd), silver (Ag), or gold (Au) or an alloy of two or more of them. The dielectric layer 11 is mainly composed of a ceramic material having a perovskite structure expressed by a general formula $ABO_3$. The perovskite structure includes $ABO_{3-\alpha}$ having an off-stoichiometric composition. In the present embodiment, the ceramic material including at least titanium (Ti) in the B site is used. For example, examples of such a ceramic material include barium titanate ($BaTiO_3$), calcium titanate ($CaTiO_3$), strontium titanate ($SrTiO_3$), or $Ba_{1-x-y}Ca_xSr_yTi_{1-z}Zr_zO_3$ ($0 \leq x \leq 1$, $0 \leq y \leq 1$, $0 \leq z \leq 1$) having a perovskite structure.

As illustrated in FIG. 2, the section where the internal electrode layers 12 connected to the external electrode 20a are opposed to the internal electrode layers 12 connected to the external electrode 20b is the section where an electric capacitance is generated in the multilayer ceramic capacitor 100. This section will be referred to as a capacitance section 14. That is, the capacitance section 14 is the section where two adjacent internal electrode layers 12 connected to different external electrodes are opposed to each other.

The section where the internal electrode layers 12 connected to the external electrode 20a are opposed to each other with no internal electrode layer 12 connected to the external electrode 20b interposed therebetween is referred to as an end margin 15. The section where the internal electrode layers 12 connected to the external electrode 20b are opposed to each other with no internal electrode layer 12 connected to the external electrode 20a interposed therebetween is also the end margin 15. That is, the end margin 15 is the section where the internal electrode layers 12 connected to one of the external electrodes are opposed to each other with no internal electrode layer 12 connected to the other of the external electrodes interposed therebetween. The end margin 15 is the section where no capacitance is generated.

As illustrated in FIG. 3, in the multilayer chip 10, the sections from the respective side faces of the multilayer chip 10 to the internal electrode layers 12 are referred to as side margins 16. That is, the side margins 16 are the sections that cover the edges of the stacked internal electrode layers 12 extending to the respective side faces in the multilayer structure.

Figure 4A:
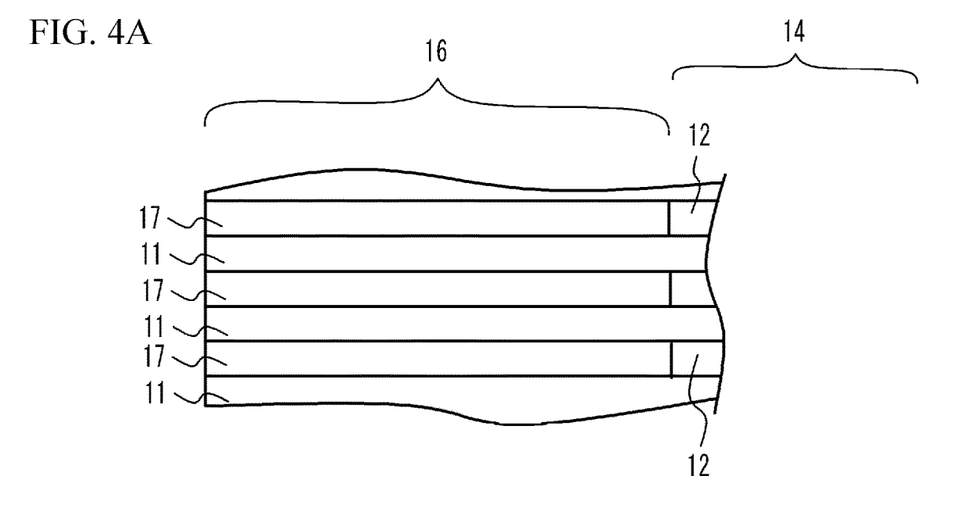
FIG. 4A is an enlarged view of the cross-section of a side margin.

FIG. 4A is an enlarged view of the cross-section of the side margin 16. The side margin 16 has a structure in which the dielectric layers 11 and inverse pattern layers 17 are alternately stacked in the direction in which the dielectric layers 11 and the internal electrode layers 12 are stacked in the capacitance section 14. Each dielectric layer 11 in the capacitance section 14 and the corresponding dielectric layers 11 in the side margins 16 form a continuous layer. This structure reduces the level difference between the capacitance section 14 and the side margins 16.

Figure 4B:
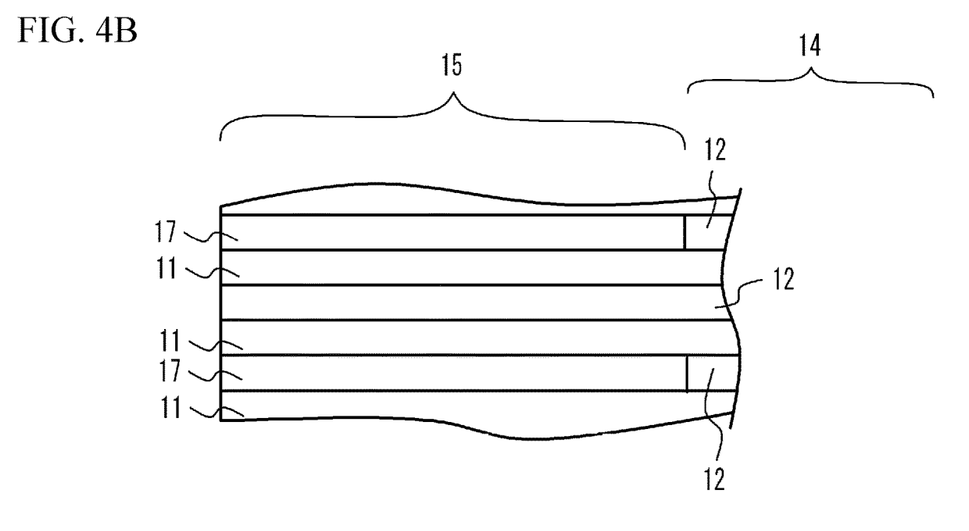
FIG. 4B is an enlarged view of the cross-section of an end margin.

FIG. 4B is an enlarged view of the cross-section of the end margin 15. In comparison with the side margin 16, in the end margin 15, every other internal electrode layer 12 of the stacked internal electrode layers 12 extends to the outer end face of the end margin 15. In addition, in the layers where the internal electrode layers 12 extend to the outer end face of the end margin 15, no inverse pattern layer 17 is stacked. Each dielectric layer 11 in the capacitance section 14 and the corresponding dielectric layers 11 in the end margins 15 form a continuous layer. This structure reduces the level difference between the capacitance section 14 and the end margins 15.

Figure 5:
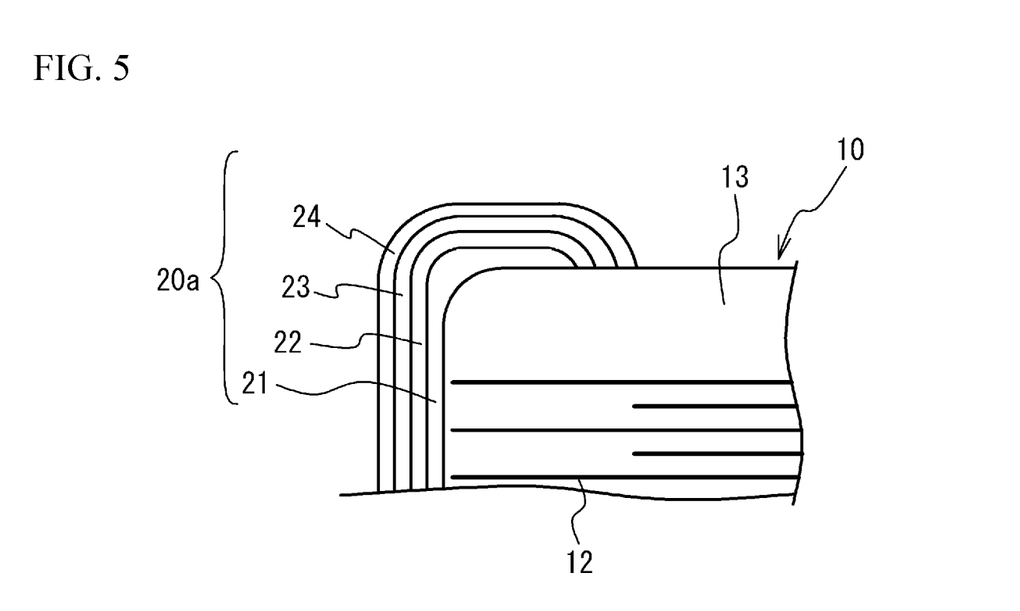
FIG. 5 is a cross-sectional view of an external electrode, and is a partial cross-sectional view taken along line A-A in FIG. 1.

FIG. 5 is a cross-sectional view of the external electrode 20a, and is a partial cross-sectional view taken along line A-A in FIG. 1. In FIG. 5, hatching for expressing the cross-section is omitted. As illustrated in FIG. 5, the external electrode 20a has a structure in which a first plated layer 22 made of Cu or the like is formed on a base layer 21, a second plated layer 23 made of Ni or the like is formed on the first plated layer 22, and a third plated layer 24 made of Sn or the like is formed on the second plated layer 23. The base layer 21 is mainly composed of a metal such as Cu, Ni, aluminum (Al), or zinc (Zn), and contains a glass component for densifying the base layer 21 and a co-material for controlling the sinterability of the base layer 21. The base layer 21, the first plated layer 22, the second plated layer 23, and the third plated layer 24 extend from the edge face of the multilayer chip 10 to the four side faces of the multilayer chip 10. The external electrode 20b has the same structure as the external electrode 20a.

During manufacturing of the multilayer ceramic capacitor 100, hydrogen may be absorbed into the capacitance section 14. Hydrogen absorbed in the capacitance section 14 dispersedly exists in the dielectric layer 11, and may deteriorate the insulation resistance of the dielectric layer 11. To reduce deterioration in the insulation resistance of the dielectric layer 11, the less contained amount of hydrogen in the dielectric layer 11 is more desirable. In particular, deterioration in the insulation resistance of the dielectric layer 11 in the capacitance section 14 causes deterioration in the performance of the multilayer ceramic capacitor 100. Thus, the less contained amount of hydrogen in the capacitance section 14 is more desirable.

The inventors found that sufficient insulation resistance of the dielectric layer 11 is achieved regardless of the size of the capacitance section 14 by adjusting the ratio of the concentration of hydrogen to the concentration of titanium contained in the B site of the main component ceramic having a perovskite structure of the dielectric layer 11 to be equal to or less than a predetermined value.

The amount of hydrogen and the amount of titanium contained in the capacitance section 14 can be measured by preparing a sample of the multilayer ceramic capacitor containing hydrogen in the dielectric layer 11 in advance, and measuring the sample using secondary ion mass spectrometry (SIMS). The measurement region is a region of 100 µm×100 µm in the cross-section of the capacitance section 14. The measurement region is not limited to the above region, and may be selected so that the region of the capacitance section 14 can be measured, and may be a region of 50 µm×50 µm, or a region of 150 µm×150 µm. The measurement using SIMS eliminates the need for removing the external electrode before measurement. Therefore, the concentration of hydrogen can be easily measured. The measurement using SIMS is effective particularly for small size multilayer ceramic capacitors 100 where it is difficult to remove the external electrode.

For example, IMS-7f (CAMECA SAS) can be used for the SIMS measurement. The measurement can be conducted under the conditions where the primary ion species is cesium (Ce) and the primary accelerating voltage is 15 kV. The primary ion species may be chemically active ions such as oxygen (O). The measurement region can be the cross-section of 100 µm×100 µm in the stack direction within the capacitance section 14. As in the region a illustrated in FIG. 2, the internal electrode layer 12 may be included in addition to the dielectric layer 11. The average of the concentration of hydrogen in the measurement region is defined as the average concentration x. The average of the concentration of titanium in the measurement region is defined as the average concentration y. The normalized concentration x/y of hydrogen is obtained from the average concentration x and the average concentration y. The inventors found that sufficiently large insulation resistance (IR) of the dielectric layer 11 is achieved by adjusting x/y to be 0.143 or less. For example, in the stack direction of the dielectric layers 11, an electric resistance of 100 MΩ or greater is achieved in each dielectric layer 11. To reduce deterioration in the insulation resistance of the dielectric layer 11, x/y is preferably 0.143 or less, and is more preferably 0.113 or less when it is assumed that the electric resistance of the dielectric layer 11 is 1 GΩ.

Second Embodiment

Figure 6A:
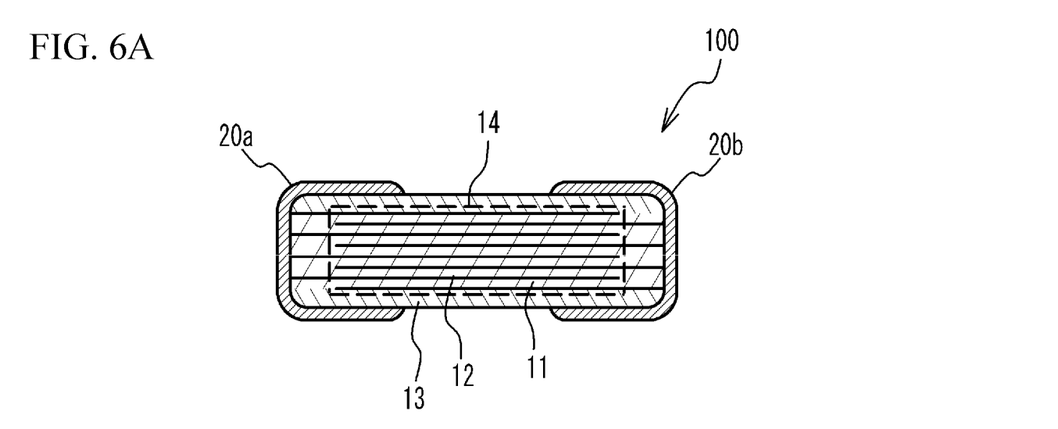
FIG. 6A is a schematic cross-sectional view illustrating a multilayer ceramic capacitor in accordance with a second embodiment.

FIG. 6A is a schematic cross-sectional view of the multilayer ceramic capacitor 100 in accordance with a second embodiment. In the second embodiment, the multilayer ceramic capacitor 100 is a low-height multilayer ceramic capacitor. For example, the low-height multilayer ceramic capacitor 100 has a height of 0.3 mm or less. Alternatively, for example, the low-height multilayer ceramic capacitor 100 may have a length of 1.0 mm, a width of 0.5 mm, and a height of 0.3 mm. Alternatively, the low-height multilayer ceramic capacitor 100 may have a length of 1.0 mm, a width of 0.5 mm, and a height of 0.15 mm. Alternatively, the low-height multilayer ceramic capacitor 100 may have a length of 1.0 mm, a width of 0.6 mm, and a height of 0.064 mm. The height is a height in the stack direction of the dielectric layers 11.

Figure 6B:
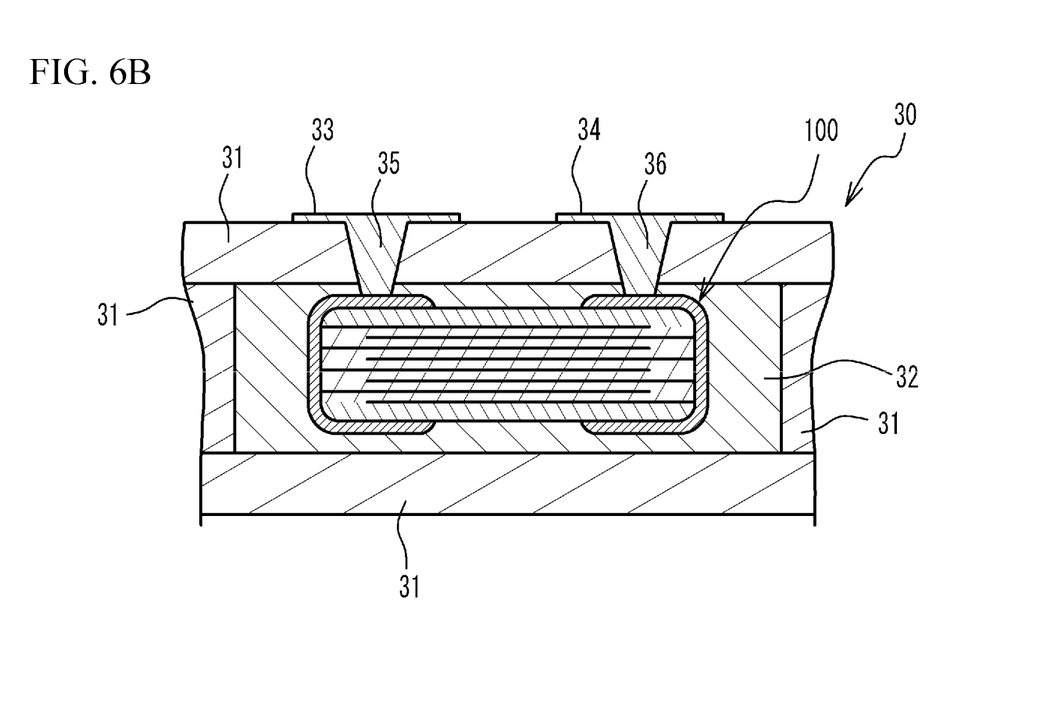
FIG. 6B illustrates a mounting board.

As illustrated in FIG. 6B, the low-height multilayer ceramic capacitor 100 is mounted to a mounting board 30 while being embedded in the mounting board 30, for example. That is, the multilayer ceramic capacitor 100 is mounted inside the mounting board 30.

The mounting board 30 is formed by stacking a plurality of insulating layers 31. The insulating layer 31 is made of an insulating material such as ceramic or resin, and are integrated with each other by bonding. The multilayer ceramic capacitor 100 is placed in a space formed in the mounting board 30, and is fixed to the mounting board 30 by resin 32 filling the space. Thus, the multilayer ceramic capacitor 100 is embedded inside the mounting board 30. The multilayer ceramic capacitor 100 is electrically connected to electrodes 33 and 34 disposed on the surface of the mounting board 30 through via conductors 35 and 36. That is, the external electrode 20a is electrically connected to the electrode 33 through the via conductor 35, and the external electrode 20b is electrically connected to the electrode 34 through the via conductor 36.

Also in such a low-height multilayer ceramic capacitor 100, sufficiently large insulation resistance of the dielectric layer 11 is achieved by adjusting x/y to be 0.143 or less.

Figure 7:
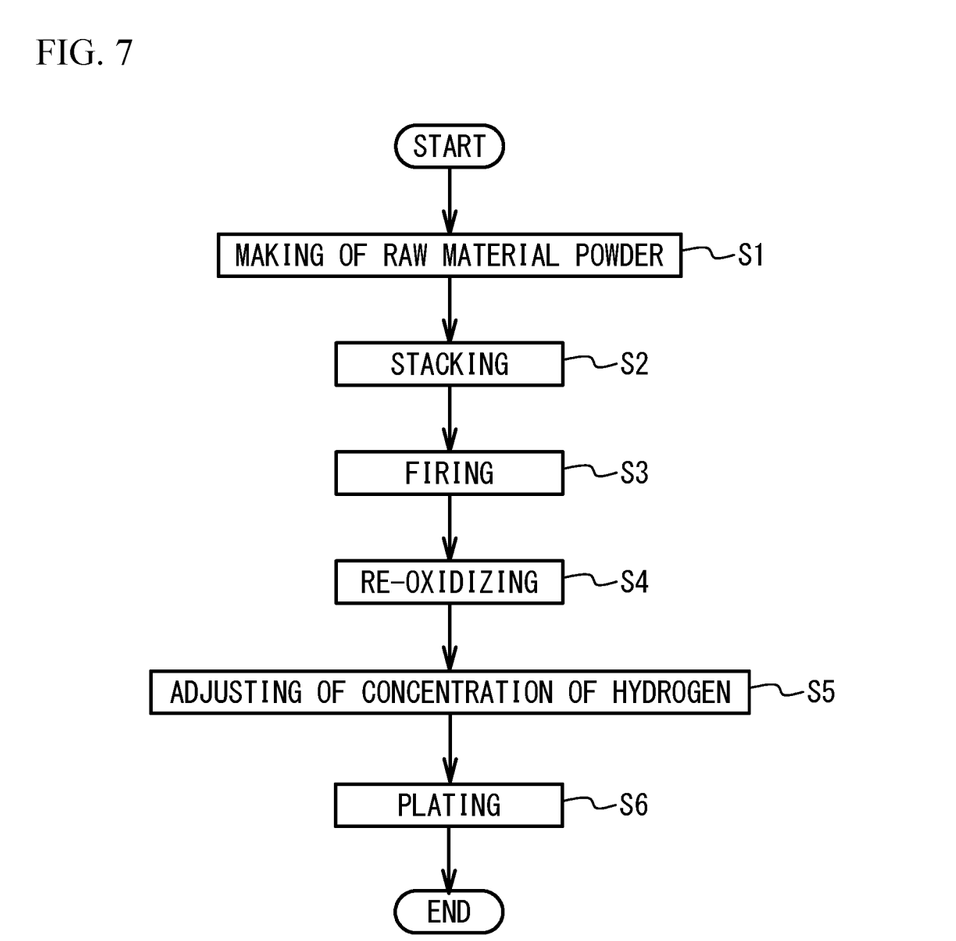
FIG. 7 is a flowchart of a manufacturing method of the multilayer ceramic capacitor.

A description will next be given of a manufacturing method of the multilayer ceramic capacitor 100. FIG. 7 is a flowchart of the manufacturing method of the multilayer ceramic capacitor 100.

[Making of Raw Material Powder (S1)]

A dielectric material for forming the dielectric layer 11 is prepared. The dielectric layer 11 contains the main component ceramic of the dielectric layer 11. The A site element and the B site element contained in the dielectric layer 11 are contained in the dielectric layer 11 typically in the form of a sintered compact of $ABO_3$ particles. For example, $BaTiO_3$ is a tetragonal compound having a perovskite structure, and exhibits high permittivity. This $BaTiO_3$ can be obtained typically by reacting a titanium raw material such as titanium dioxide with a barium raw material such as barium carbonate to synthesize barium titanate. Various methods have been known as a synthesizing method of the main component ceramic of the dielectric layer 11. For example, the solid phase method, the sol-gel method, the hydrothermal method, and the like are known. Any one of the above methods can be employed in the present embodiment.

Additive compound is added to the resulting ceramic powder in accordance with purposes. The additive compound may be an oxide of magnesium (Mg), manganese (Mn), vanadium (V), chromium (Cr) or a rare earth element (yttrium (Y), samarium (Sm), europium (Eu), gadolinium (Gd), terbium (Tb), dysprosium (Dy), holmium (Ho), erbium (Er), thulium (Tm), or ytterbium (Yb)), or an oxide of cobalt (Co), Ni, lithium (Li), B, sodium (Na), potassium (K) or Si, or glass containing Co, Ni, Li, B, Na, K, or Si.

Next, an inverse pattern material for forming the end margin 15 and the side margin 16 is prepared. The inverse pattern material contains the main component ceramic of the end margin 15 and the side margin 16. For example, $BaTiO_3$ powder is made as the main component ceramic. $BaTiO_3$ powder can be made through the same process as the dielectric material. Additive compound is added to the resulting $BaTiO_3$ powder in accordance with purposes. The additive compound may be an oxide of Mg, Mn, V, Cr, or a rare-earth element (Y, Sm, Eu, Gd, Tb, Dy, Ho, Er, Tm, or Yb), an oxide of Co, Ni, Li, B, Na, K, or Si, or glass containing Co, Ni, Li, B, Na, K, or Si. The dielectric material described above may be used as the inverse pattern material.

Next, a cover material for forming the cover layers 13 is prepared. The cover material contains the main component ceramic of the cover layers 13. For example, $BaTiO_3$ powder is made as the main component ceramic. $BaTiO_3$ powder is made through the same process as the dielectric material. Additive compound is added to the resulting $BaTiO_3$ powder in accordance with purposes. The additive compound may be an oxide of Mg, Mn, V, Cr, or a rare-earth element (Y, Sm, Eu, Gd, Tb, Dy, Ho, Er, Tm, or Yb), an oxide of Co, Ni, Li, B, Na, K, or Si, or glass containing Co, Ni, Li, B, Na, K, or Si. The dielectric material described above is used as the cover material.

[Stacking Process (S2)]

Next, a binder such as polyvinyl butyral (PVB) resin, an organic solvent such as ethanol or toluene, and a plasticizer are added to the resulting dielectric material and wet-blended. With use of the resulting slurry, a dielectric green sheet 51 is coated on a base material using, for example, a die coater method or a doctor blade method, and then dried.

Figure 8A:
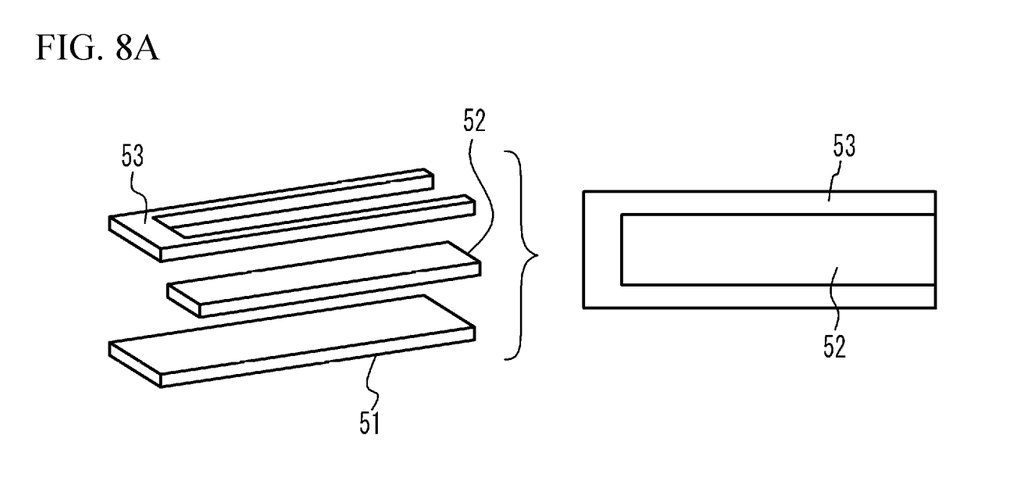
FIG. 8A and FIG. 8B illustrate a stacking process.

Next, as illustrated in FIG. 8A, a first pattern 52 of the internal electrode layer is formed on the surface of the dielectric green sheet 51 by printing a metal conductive paste for forming the internal electrode with use of screen printing or gravure printing. The metal conductive paste for forming the internal electrode contains an organic binder. Ceramic particles are added as a co-material to the metal conductive paste. The main component of ceramic particles is not particularly limited, but is preferably the same as the main component ceramic of the dielectric layer 11.

Next, a binder such as an ethylcellulose-based binder and an organic solvent such as a terpineol-based solvent are added to an inverse pattern material and kneaded using a roll mill to obtain an inverse pattern paste for the inverse pattern layer. As illustrated in FIG. 8A, a second pattern 53 is formed by printing the inverse pattern paste in the peripheral region, where no first pattern 52 is printed, on the dielectric green sheet 51 so that the second pattern 53 and the first pattern 52 form a flat surface.

Figure 8B:
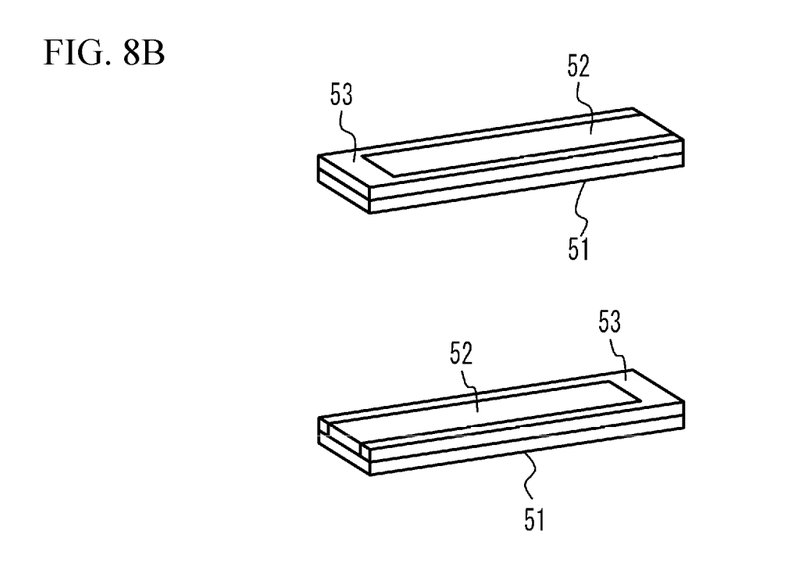

Thereafter, as illustrated in FIG. 8B, the dielectric green sheet 51, the first pattern 52, and the second pattern 53 are stacked so that the internal electrode layers 12 and the dielectric layers 11 are alternated and the end edges of the internal electrode layers 12 are alternately exposed to both edge faces in the length direction of the dielectric layer 11 so as to be alternately led out to a pair of the external electrodes 20a and 20b of different polarizations. For example, the number of the dielectric green sheets 51 to be stacked is 100 to 500 layers.

Figure 9:
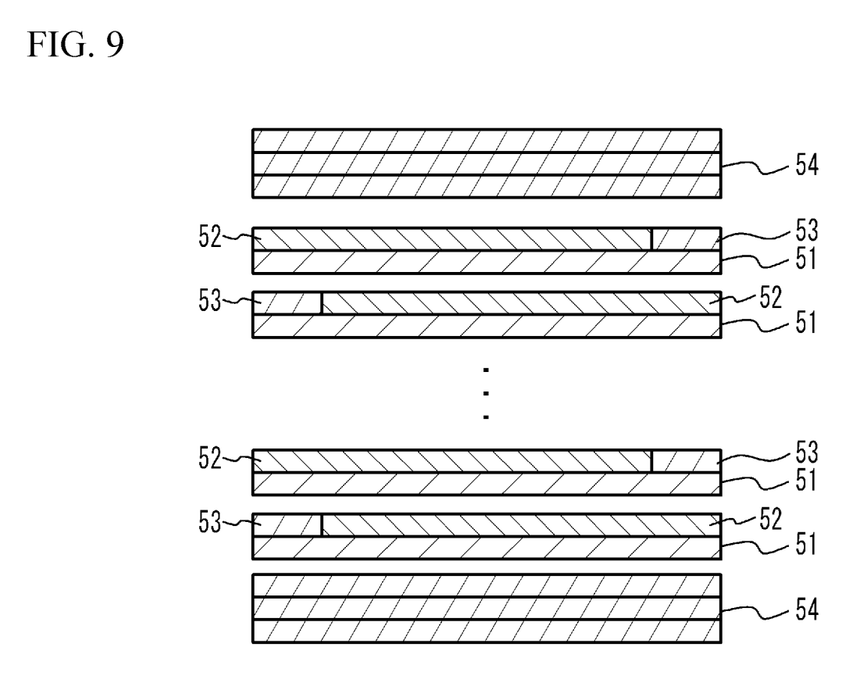
FIG. 9 illustrates the stacking process.

Next, a binder such as polyvinyl butyral (PVB) resin, an organic solvent such as ethanol or toluene, and a plasticizer are added to the resulting cover material and wet-blended. With use of the resulting slurry, a strip-shaped cover sheet 54 with a thickness of 10 µm or less is coated on a base material using, for example, a die coater method or a doctor blade method, and then dried. As illustrated in FIG. 9, the predetermined number (e.g., 2 to 10) of the cover sheets 54 are stacked on and under the stacked dielectric green sheets 51 and are thermally compressed. The resulting multilayer structure is cut into a predetermined chip size (for example, 1.0 mm×0.5 mm). Thereafter, a metal conductive paste to be the base layer 21 is coated on each of the two edge faces of the cut multilayer structure. Through this process, a ceramic multilayer structure is obtained. The predetermined number of the cover sheets 54 may be stacked and compressed, and then attached on and under the stacked dielectric green sheets 51.

In the method illustrated in FIG. 8A, FIG. 8B, and FIG. 9, the section where the part corresponding to the first pattern 52 of the dielectric green sheet 51 and the first pattern 52 are stacked corresponds to the multilayer portion where the sheets of which the main component ceramic is $BaTiO_3$ particles and patterns of the metal conductive paste are stacked. The section where the part protruding outward from the first pattern 52 of the dielectric green sheet 51 and the second pattern 53 are stacked corresponds to the side margin section disposed on each of the side faces of the multilayer portion.

Figure 10:
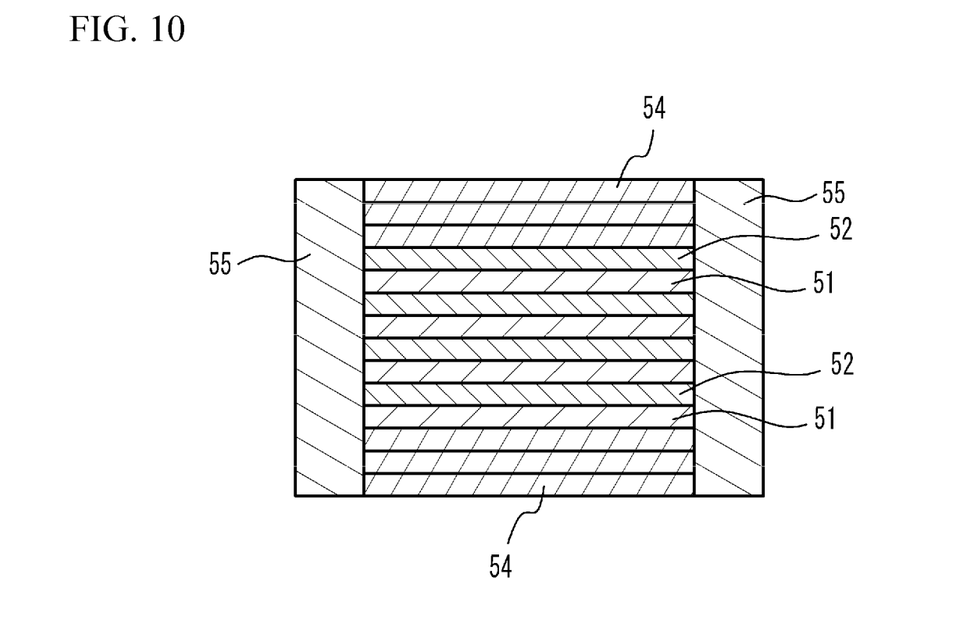
FIG. 10 illustrates the stacking process.

The side margin section may be attached to or applied to each of the side faces of the multilayer portion. Specifically, as illustrated in FIG. 10, the multilayer portion is obtained by alternately stacking the dielectric green sheets 51 and the first patterns 52 having widths identical to the width of the dielectric green sheet 51. Then, a sheet 55 formed of the inverse pattern paste is attached to each of the side faces of the multilayer portion to form the side margin sections, or the side margin sections may be formed by applying the inverse pattern paste to each of the side faces of the multilayer portion.

[Firing Process (S3)]

A binder is removed from the resulting ceramic multilayer structure in a $N_2$ atmosphere, and then a Ni paste to be the base for the external electrodes 20a and 20b is applied by dipping, and then fired in a reductive atmosphere with an oxygen partial pressure of $10^{-5}$ to $10^{-8}$ atm in a temperature range of 1100° C. to 1300° C. for 10 minutes to 2 hours. Through the above processes, the multilayer ceramic capacitor 100 is obtained.

[Re-Oxidizing Process (S4)]

Thereafter, the re-oxidizing process is performed in a $N_2$ gas atmosphere in a temperature range of 600° C. to 1000° C.

[Adjusting of the Concentration of Hydrogen (S5)]

Next, the concentration of hydrogen in the capacitance section 14 is adjusted. For example, heat treatment in an atmosphere in which the $H_2$ gas concentration is controlled allows the adjustment of the concentration of hydrogen in the capacitance section 14. For example, the heat treatment temperature is set at 150° C. or greater and 580° C. or less, and the heat treatment time is set at 100 minutes or greater and 150 minutes or less. In addition, the concentration of $H_2$ in the atmosphere gas is adjusted to be less than 3.0%. This condition allows x/y in the capacitance section 14 to become 0.143 or less. When the $H_2$ concentration in the atmosphere gas is excessively small, the plating solution is less likely to adhere because of surface oxides. Thus, the $H_2$ concentration in the atmosphere gas is preferably 0.1% or greater. For example, the $H_2$ concentration in the atmosphere gas is preferably 0.15% or greater.

[Plating (S6)]

Thereafter, the first plated layer 22, the second plated layer 23, and the third plated layer 24 may be formed on the base layer 21 by plating.

The manufacturing method in accordance with the present embodiment allows x/y in the capacitance section 14 to be adjusted to 0.143 or less. In this case, the contained amount of hydrogen in the capacitance section 14 can be sufficiently reduced. Thus, sufficiently large insulation resistance of the dielectric layer 11 can be achieved.

The present embodiments achieve high insulation resistance (IR) of the dielectric layer 11, and therefore achieves the multilayer ceramic capacitor having a small size and a high capacitance. For example, as a component having X7R characteristics specified by EIA (Electronic Industries Association) standards, a multilayer ceramic capacitor that has a size of 0.6±0.03 mm (length)×0.3±0.03 mm (width)×0.3±0.03 mm (height), which is referred to as a 0603 size, has a rated voltage of 16V or 25V, and has a capacitance value of 0.22 μF or greater is achieved. Furthermore, a multilayer ceramic capacitor that has X7R characteristics, has a size of 1.0-0.05 to 1.0+0.15 mm (length)×0.5-0.05 to 0.5+0.15 mm (width)×0.5-0.05 to 0.5+0.15 mm (height), which is referred to as a 1005 size, has a rated voltage of 25V, and has a capacitance value of 0.47 μF or greater is achieved, and a multilayer ceramic capacitor that has X7R characteristics, has a 1005 size, has a rated voltage of 50 V, and has a capacitance value of 0.22 μF or greater is achieved.

In the above embodiments, a multilayer ceramic capacitor is described as an example of the ceramic electronic component, but the ceramic electronic component is not limited to the multilayer ceramic capacitor. For example, the ceramic electronic component may be other electronic components such as a varistor and a thermistor.

EXAMPLES

Examples 1 to 4 and Comparative Examples 1 and 2

Additives were added to barium titanate powder, and were sufficiently wet-blended and crushed in a ball mill to obtain a dielectric material. Additives were added to barium titanate powder, and were sufficiently wet-blended and crushed in a ball mill to obtain an inverse pattern material. Additives were added to barium titanate powder, and were sufficiently wet-blended and crushed in a ball mill to obtain a cover material.

An organic binder and solvents were added to the dielectric material, and the dielectric green sheets 51 were made using a doctor blade method. The organic binder was a butyral-based binder. The solvents were toluene and ethyl alcohol. The first pattern 52 of the metal conductive paste was printed on the resulting dielectric green sheet 51. A binder such as an ethylcellulose-based binder and an organic solvent such as a terpineol-based solvent were added to the inverse pattern material, and kneaded with a roll mill to make the inverse pattern paste. The inverse pattern paste was printed as the second pattern 53 in the region where no first pattern 52 was printed on the dielectric green sheet 51. Seventy dielectric green sheets 51 each having the first pattern 52 and the second pattern 53 printed thereon were printed were stacked.

An organic binder and solvents were added to the cover material, and the cover sheet was made using a doctor blade method. The organic binder was a butyral-based binder. The solvents were toluene and ethyl alcohol. The cover sheets were stacked on and under the multilayer structure of the dielectric green sheets 51, and the resulting multilayer structure was heated and compressed. The thickness of the cover sheet was 20 μm.

Thereafter, the binder was removed in a $N_2$ atmosphere. Ni external electrodes were formed on the resulting multilayer structure by dipping, and were then fired under a reductive atmosphere ($O_2$ partial pressure: $10^{-5}$ to $10^{-8}$ atm) to obtain a sintered compact. The shape size was a length of 1.0 mm, a width of 0.5 mm, and a height of 0.2 mm. The sintered compact was re-oxidized under a $N_2$ atmosphere at 800° C. After firing, the thickness of the dielectric layer 11 was 1 μm.

Thereafter, the concentration of hydrogen in the capacitance section 14 was adjusted through the heat treatment in the atmosphere containing $H_2$. In the example 1, the $H_2$ concentration in the atmosphere gas was adjusted to be 0.0%. In the example 2, the $H_2$ concentration in the atmosphere gas was adjusted to be 0.15%. In the example 3, the $H_2$ concentration in the atmosphere gas was adjusted to be 1.0%. In the example 4, the $H_2$ concentration in the atmosphere gas was adjusted to be 2.0%. In the comparative example 1, the $H_2$ concentration in the atmosphere gas was adjusted to be 3.0%. In the comparative example 2, the $H_2$ concentration in the atmosphere gas was adjusted to be 4.0%. The heat treatment temperature was 300° C. The heat treatment time was 120 minutes.

Thereafter, metals of Cu, Ni, and Sn were coated on the surface of the external electrode terminal by plating to obtain the multilayer ceramic capacitor 100.

For the multilayer ceramic capacitors 100 of the examples 1 to 4 and the comparative examples 1 and 2, the concentration of hydrogen and the concentration of titanium in the capacitance section 14 were measured using SIMS. IMS-7f (CAMECA SAS) was used for the SIMS measurement. The SIMS measurement was conducted under the conditions where the primary ion species was cesium (Ce) and the primary accelerating voltage was 15 kV. The measurement region was 100 µm×100 µm.

The measurement results are presented in Table 1. As presented in Table 1, in the example 1, x/y in the capacitance section 14 was 0.103. In the example 2, x/y in the capacitance section 14 was 0.107. In the example 3, x/y in the capacitance section 14 was 0.110. In the example 4, x/y in the capacitance section 14 was 0.126. In the comparative example 1, x/y in the capacitance section 14 was 0.144. In the comparative example 2, x/y in the capacitance section 14 was 0.161.

TABLE 1

|  | H₂ gas concentration | x/y | IR [MΩ] | IR × Number of layers [MΩ] | Electric Resistivity [MΩ · cm] |
|---|---|---|---|---|---|
| Example 1 | 0.0% | 0.103 | 3400 | 234600 | 7152 |
| Example 2 | 0.15% | 0.107 | 2500 | 172500 | 5259 |
| Example 3 | 1.0% | 0.110 | 770 | 53130 | 1620 |
| Example 4 | 2.0% | 0.126 | 650 | 44850 | 1367 |
| Comparative example 1 | 3.0% | 0.144 | 90 | 6210 | 189.3 |
| Comparative example 2 | 4.0% | 0.161 | 40 | 2760 | 84.14 |

Figure 11:
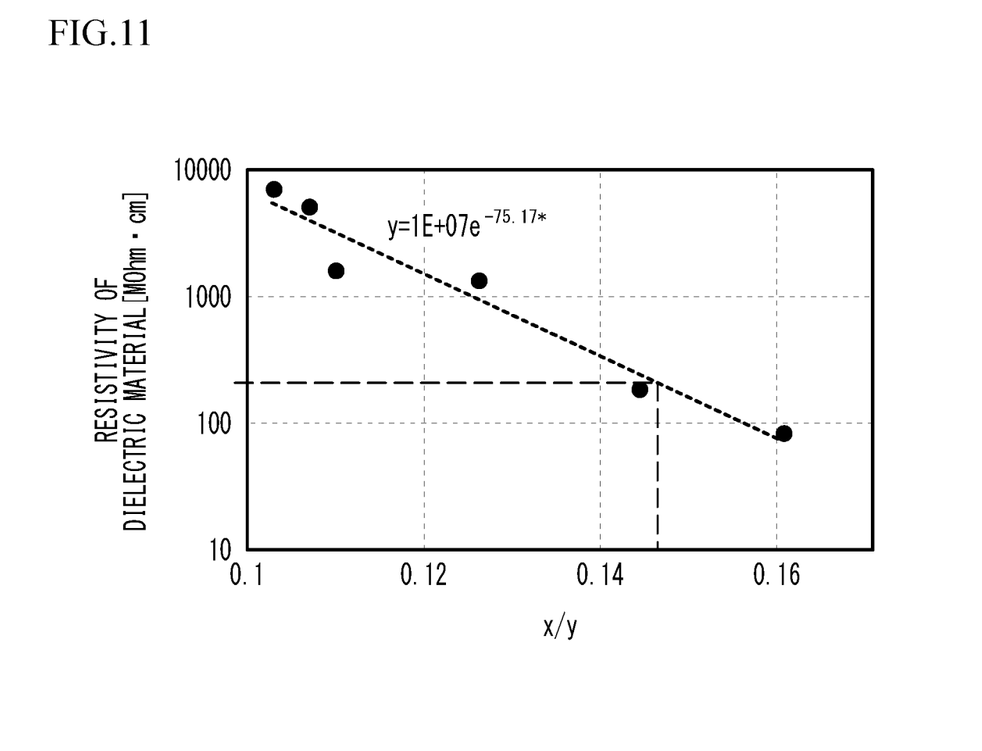
FIG. 11 presents results of examples and comparative examples.

FIG. 11 presents results of the examples 1 to 4 and the comparative examples 1 and 2, and is a graph of the electric resistivity of the dielectric material versus x/y. The electric resistivity of the dielectric substance was calculated from the insulation resistance (IR) of one dielectric layer 11 when the rated current is held for 60 seconds, the number of the dielectric layer 11 that are stacked, the thickness of each dielectric layer 11, and the area where the dielectric layer 11 and the internal electrode layer 12 are opposed to each other in the capacitance section 14. For example, the IR required as a product standard for the multilayer ceramic capacitor 100 having a size of 1.0 mm×0.5 mm×0.2 mm and including 70 internal electrode layers 12 is 100 MΩ or greater. To satisfy this standard, the electric resistivity of the dielectric substance is required to be 210 MΩ·cm or greater. The regression line was calculated from the plotted results, and it was confirmed that x/y is required to be 0.143 or less. It is considered that in the comparative examples 1 and 2, since x/y was greater than 0.143, the IR could not be made to be sufficiently large, and in the examples 1 to 4, the IR was made to be sufficiently large by adjusting x/y to be 0.143 or less.

Although the embodiments of the present invention have been described in detail, it is to be understood that the various change, substitutions, and alterations could be made hereto without departing from the spirit and scope of the invention.

What is claimed is:

1. A ceramic electronic component comprising:
a multilayer structure having a substantially rectangular parallelepiped shape and including dielectric layers and internal electrode layers that are alternately stacked, the dielectric layers being mainly composed of ceramic, the internal electrode layers being alternately exposed to two edge faces of the multilayer structure opposite to each other,
wherein x/y is 0.103 or more and 0.126 or less where x represents an average concentration of hydrogen in ppm in a capacitance section where the internal electrode layers exposed to one of the two edge faces and the internal electrode layers exposed to the other of the two edge faces are opposed to each other, as measured by secondary ion mass spectrometry (SIMS), and y represents an average concentration of titanium in ppm in the capacitance section, as measured by SIMS at the same time of measuring the average concentration of hydrogen, and
wherein a height of the ceramic electronic component is 0.3 mm or less in a stack direction of the dielectric layers.

2. The ceramic electronic component according to claim 1, further comprising a pair of external electrodes respectively formed on the two edge faces,
wherein the external electrode includes a plated layer.

3. The ceramic electronic component according to claim 1, wherein an electric resistance of each of the dielectric layers is 100 MΩ or greater in a stack direction of the dielectric layers.

4. The ceramic electronic component according to claim 1,
wherein the internal electrode layers are mainly composed of nickel, and
wherein the dielectric layers are mainly composed of barium titanate.

5. The ceramic electronic component according to claim 1,
wherein the ceramic electronic component is a multilayer ceramic capacitor, and
wherein the multilayer ceramic capacitor has X7R characteristics, has a 0603 size, has a rated voltage of 16 V or 25 V, and has a capacitance value of 0.22 µF or greater.

6. The ceramic electronic component according to claim 1,
wherein the ceramic electronic component is a multilayer ceramic capacitor, and
wherein the multilayer ceramic capacitor has X7R characteristics, has a 1005 size, has a rated voltage of 25 V, and has a capacitance value of 0.47 µF or greater, or the multilayer ceramic capacitor has X7R characteristics, has a 1005 size, has a rated voltage of 50 V, and has a capacitance value of 0.22 µF or greater.

7. A component installed board comprising:
a mounting board; and
the ceramic electronic component according to claim 1, installed in the mounting board.

8. The component installed board according to claim 7, wherein the mounting board includes a pair of insulating layers, and wherein the ceramic electronic component is disposed between the pair of insulating layers of the mounting board.

9. The component installed board according to claim 7, further comprising via conductors, each of which is provided from each of the pair of external electrodes to a surface of the mounting board.

10. The ceramic electronic component according to claim 1, wherein a main component of the dielectric layers is $Ba_{1-x-y}Ca_xSr_yTi_{1-z}Zr_zO_3$ ($0 \leq x \leq 1$, $0 \leq y \leq 1$, $0 \leq z \leq 1$).

11. The ceramic electronic component according to claim 1,
wherein a main component of the dielectric layers is barium titanate.

12. The ceramic electronic component according to claim 1,
wherein a main component of the internal electrode layers is nickel.

13. The ceramic electronic component according to claim 12,
wherein the internal electrode layers include at least one of platinum, palladium, silver, or gold.

14. The ceramic electronic component according to claim 1, further comprising a pair of external electrodes respectively formed on the two edge faces,
wherein the external electrode includes a base layer and a plated layer formed on the base layer,
wherein a main component of the base layer is nickel.

15. The ceramic electronic component according to claim 1, further comprising a pair of external electrodes respectively formed on the two edge faces,
wherein the external electrode includes a base layer and a plated layer formed on the base layer,
wherein a main component of the base layer is copper.

16. The ceramic electronic component according to claim 1,
wherein a number of the internal electrode layers is 100 to 500.

17. The ceramic electronic component according to claim 1, wherein the height of the ceramic electronic component is 0.2 mm or less in the stack direction of the dielectric layers.

* * * * *